United States Patent
Zhou

(10) Patent No.: US 11,152,492 B2
(45) Date of Patent: Oct. 19, 2021

(54) SEMICONDUCTOR DEVICE AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Fei Zhou, Shanghai (CN)

(73) Assignees: Semiconductor Manufacturing International (Beijing) Corporation, Beijing (CN); Semiconductor Manufacturing International (Shanghai) Corporation, Shanghai (CN)

(*) Notice: Subject to any disclaimer, the term of this patent is extended or adjusted under 35 U.S.C. 154(b) by 32 days.

(21) Appl. No.: 16/507,703

(22) Filed: Jul. 10, 2019

(65) Prior Publication Data
US 2020/0020783 A1  Jan. 16, 2020

(30) Foreign Application Priority Data

Jul. 10, 2018  (CN) .......................... 201810750109.5

(51) Int. Cl.
*H01L 21/8238* (2006.01)
*H01L 29/66* (2006.01)
(Continued)

(52) U.S. Cl.
CPC .... *H01L 29/6681* (2013.01); *H01L 21/82385* (2013.01); *H01L 21/823821* (2013.01);
(Continued)

(58) Field of Classification Search
CPC ......... H01L 29/6681; H01L 21/823821; H01L 21/82385; H01L 29/66545; H01L 27/0924;
(Continued)

(56) References Cited

U.S. PATENT DOCUMENTS 6,521,549 B1 * 2/2003 Kamath .......... H01L 21/823462
257/E21.625
2004/0262687 A1  12/2004 Jung et al.
(Continued)

FOREIGN PATENT DOCUMENTS

CN  107039522 A  8/2017

*Primary Examiner* — Marcos D. Pizarro
*Assistant Examiner* — Sue Tang
(74) *Attorney, Agent, or Firm* — Anova Law Group, PLLC

(57) ABSTRACT

Semiconductor devices and fabrication methods are provided. An exemplary fabrication method includes providing a semiconductor substrate having a logic region and a peripheral region; forming initial fins on the semiconductor substrate; forming a protective layer on the sidewall surfaces of the initial fin in the peripheral region; removing the initial fin in the peripheral region to form a trench with a bottom surface lower than a top surface of the isolation structure; forming a modified fin made of a single material in the trench; removing the protective layer; forming a first gate structure having a first gate dielectric layer and surrounding the first fin layers in the logic region across the initial fin in the logic region; and forming a second gate structure having a second gate dielectric layer with a thickness greater than a thickness of the first gate dielectric layer across the modified fins.

20 Claims, 6 Drawing Sheets

(51) Int. Cl.
*H01L 27/092* (2006.01)
*H01L 29/16* (2006.01)

(52) U.S. Cl.
CPC .. *H01L 21/823878* (2013.01); *H01L 27/0924* (2013.01); *H01L 29/66545* (2013.01); *H01L 29/16* (2013.01)

(58) Field of Classification Search
CPC ............ H01L 21/823878; H01L 29/16; H01L 29/1079; H01L 29/0673; H01L 29/66439; H01L 29/42392; H01L 29/78696; H01L 21/823431; H01L 27/0886; H01L 21/823462; H01L 21/823412; B82Y 10/00

See application file for complete search history.

(56) References Cited

U.S. PATENT DOCUMENTS

| | | | |
|---|---|---|---|
| 2013/0207226 A1* | 8/2013 | Adam | H01L 29/1079 257/507 |
| 2016/0254382 A1* | 9/2016 | Hoentschel | H01L 21/02164 257/401 |
| 2016/0365292 A1* | 12/2016 | Cheng | H01L 21/845 |

\* cited by examiner

… …

SEMICONDUCTOR DEVICE AND FABRICATION METHOD THEREOF

CROSS-REFERENCES TO RELATED APPLICATIONS

This application claims the priority of Chinese patent application No. 201810750109.5, filed on Jul. 10, 2018, the entirety of which is incorporated herein by reference.

FIELD OF THE DISCLOSURE

The present disclosure generally relates to the field of semiconductor manufacturing and, more particularly, relates to semiconductor devices and fabrication methods.

BACKGROUND

With the rapid development of the semiconductor manufacturing technologies, semiconductor devices are moving toward higher component densities and higher integration levels. In the current semiconductor industry, integrated circuit (IC) products can be divided into three major types: logic circuit, memory, and analog circuit. To achieve high integration levels and wider application ranges, devices with different functions need to be integrated on a single chip to form embedded semiconductor apparatus. For example, the core device and the input/output devices are integrated on a same chip.

The core device bears the main functions of the semiconductor device, and the performance requirements of the core device are getting higher and higher. To meet the higher requirements for the performance of the devices, four-sided controlled gate-all-around structures have been developed. A semiconductor device having a gate-all-around structure has a special performance that effectively limits the short channel effect; and is desirable for the semiconductor industry to continue to reduce the size of the device in accordance with the Moore's Law. The device channel formed by the thin silicon film in the gate-all-around structure is surrounded by the gate of the device; and is only controlled by the gate. Thus, the short channel effect is reduced.

However, the gate-all-around structures may not be necessarily suitable for all devices; and there is a need to improve the performance of the integrated semiconductor devices that integrate a plurality of devices with multiple functions. The disclosed methods and semiconductor structures are directed to solve one or more problems set forth above and other problems in the art.

BRIEF SUMMARY OF THE DISCLOSURE

One aspect of the present disclosure includes a method for forming a semiconductor device. The method may include providing a semiconductor substrate having a logic region and a peripheral region; and forming initial fins and an isolation structure on the logic region and the peripheral region of the semiconductor substrate. The initial fins may consist of a plurality of first fin layers and second fin layers alternatively stacked along a normal direction of a surface of the semiconductor substrate; the second fin layer is formed between two adjacent first fin layers; and the isolation structure may cover portions of sidewall surfaces of the initial fin. The method may also include forming a protective layer on the sidewall surfaces of the initial fin in the peripheral region and exposing a top surface of the initial fin in the peripheral region; and removing the initial fin in the peripheral region to form a trench with a bottom surface lower than a top surface of the isolation structure in the protective layer in the peripheral region. The method may also include forming a modified fin made of a single material in the trench; removing the protective layer to expose top and sidewall surfaces of the modified fin; forming a first gate structure having a first gate dielectric layer and surrounding the first fin layers in the logic region across the initial fin in the logic region; and forming a second gate structure having a second gate dielectric layer with a thickness greater than a thickness of the first gate dielectric layer across the modified fin.

Another aspect of the present disclosure includes a semiconductor device. The semiconductor device may include a semiconductor substrate having a logic region and a peripheral region; an initial fin formed on the logic region of the semiconductor substrate. The initial fin may consist of a plurality of first fin layers stacked along a normal direction of a surface of the semiconductor substrate. The semiconductor device may also include a modified fin made of a single material and formed on the peripheral region of the semiconductor substrate; and an isolation structure covering portions of sidewall surfaces of the initial fin and the modified fin formed on the semiconductor substrate. Further, the semiconductor device may include a first gate structure formed across the initial fin, having a first gate dielectric layer and surrounding the first fin layers of the initial fin; and a second gate structure formed across the modified fin and having a second gate dielectric layer with a thickness greater than a thickness of the first gate dielectric layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
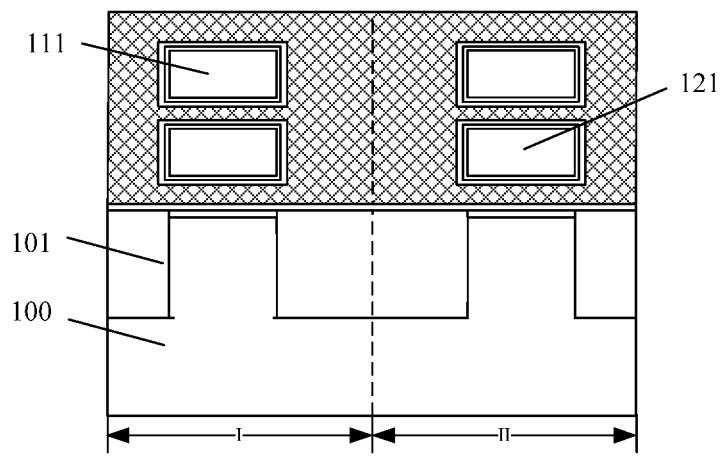
FIG. 1 illustrates a semiconductor device.

FIG. 1 illustrates a semiconductor device. As shown in FIG. 1, the semiconductor device includes a semiconductor substrate 100 having a logic region I and a peripheral region II, a logic fin formed on the logic region I of the semiconductor substrate 100, and a peripheral fin formed on the peripheral region II of the semiconductor substrate 100. The logic fin consists of a plurality of layers 111 stacked along a normal direction of the surface of the semiconductor substrate 100. The peripheral fin includes a plurality of second fin layers 121 stacked along the normal direction of the semiconductor substrate 100. The first fin layers 111 and the second fin layers 121 are made of a same material. The semiconductor device also includes an isolation layer 101 formed on the semiconductor substrate 100 and covering portions of the sidewall surfaces of the logic fins and portions of the sidewall surfaces of the peripheral fins. Further, the semiconductor device includes a first gate structure formed across the logic fin and formed on the isolation layer 101 in the logic region I. The first gate structure surrounds the first fin layers 111 of the logic fin. Further, the semiconductor device includes a second gate structure formed on the peripheral region II of the isolation layer 101 and surrounding the second fin layers 121 of the peripheral fin.

With the continuous development of the semiconductor technology, to improve the control capability of the gate structure to the channel region of the semiconductor device, the gate-all-around structure is used to improve the performance of the semiconductor device. However, the voltage of the peripheral device of the semiconductor device is substantially large, and the gate dielectric layer of the peripheral device requires a substantially thick thickness to meet the requirements. The second gate structure of the gate-all-around structure surrounds the second fin layers 121; and the space between adjacent second fin layers 121 is substantially small. After forming the relatively thick second gate dielectric layer, the space between the adjacent second fin layers 121 is too small; and it is difficult to form a work function layer or a second gate layer in the relatively small space between the adjacent second fin layers; and the quality of the work function layer is not as desired. If a thin second gate dielectric layer is formed, under a high voltage condition, the thin second gate dielectric layer is easily broken down. Thus, as described above, the performance of the semiconductor device having the gate-all-around gate structures in both the logic region and the peripheral region may not be as desired.

The present disclosure provides a semiconductor device and a method for fabricating a semiconductor device. In the disclosed method, a semiconductor device with a gate-all-around gate structure may be formed in the logic region, and a multi-gate device of a single material may be formed in the fin portion of the peripheral region. The disclosed method may improve the performance of the semiconductor device.

Figure 9:
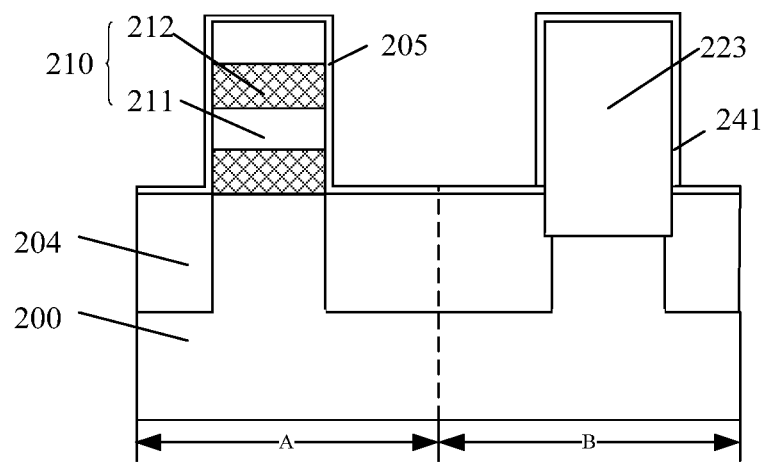
Figure 10:
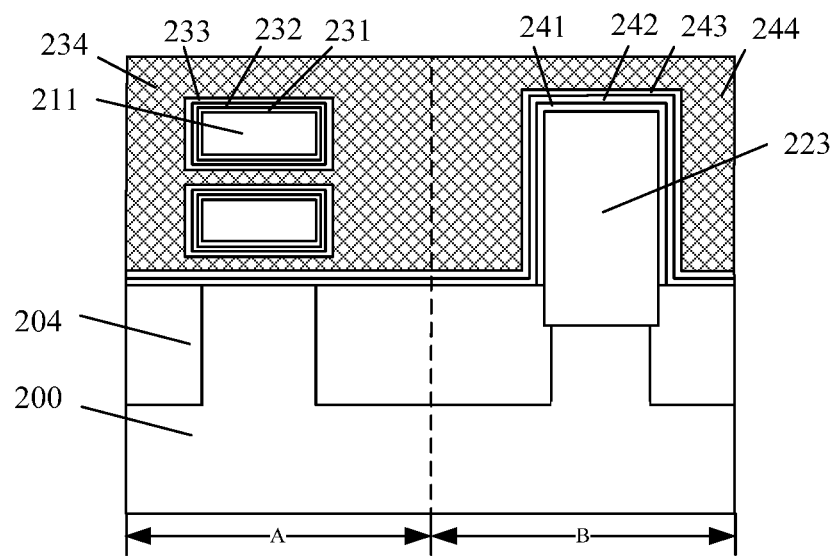
Figure 11:
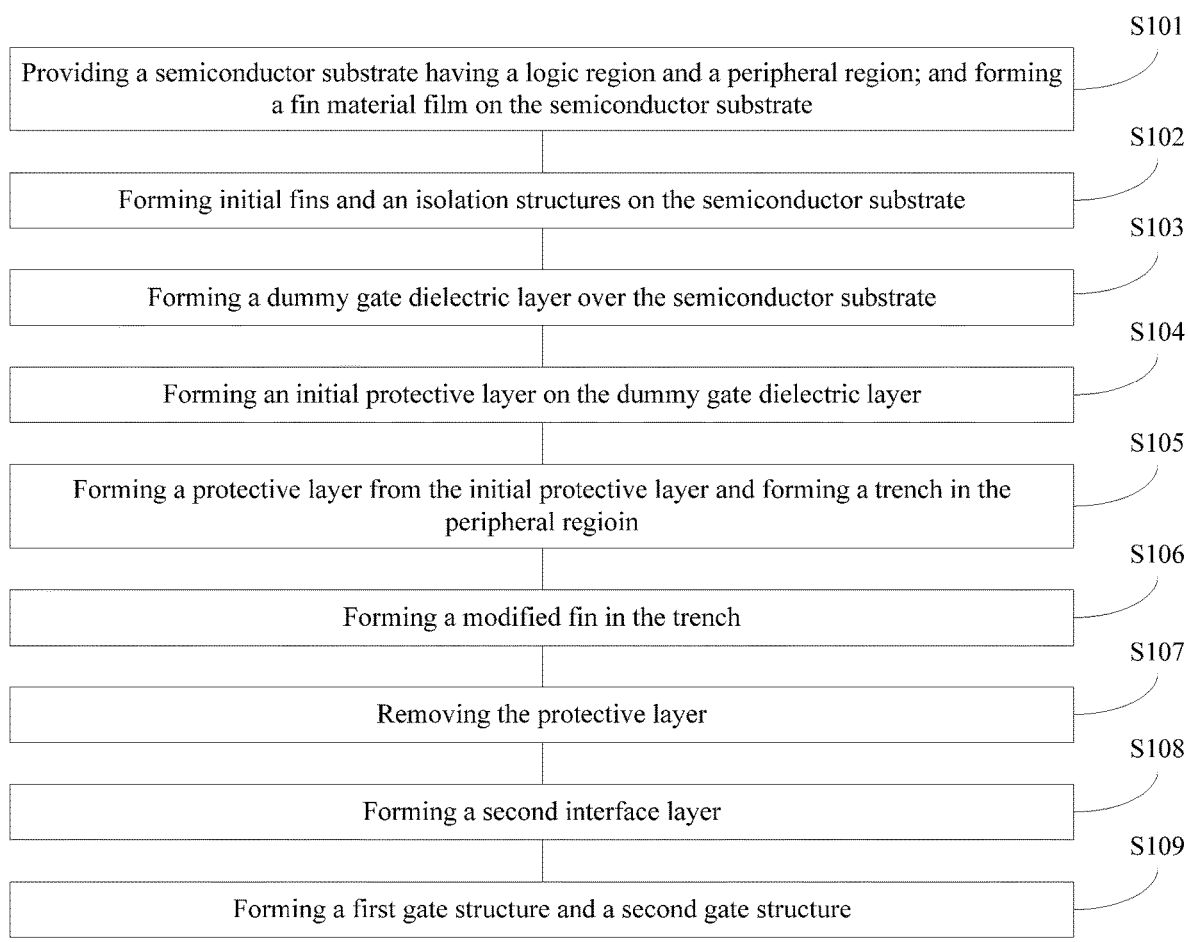
FIG. 11 illustrates an exemplary fabrication process of a semiconductor device consistent with various disclosed embodiments.

FIG. 11 illustrates an exemplary fabrication process of a semiconductor device. FIGS. 2-10 illustrate structures corresponding to certain stages during the exemplary fabrication process consistent with various disclosed embodiments.

Figure 2:
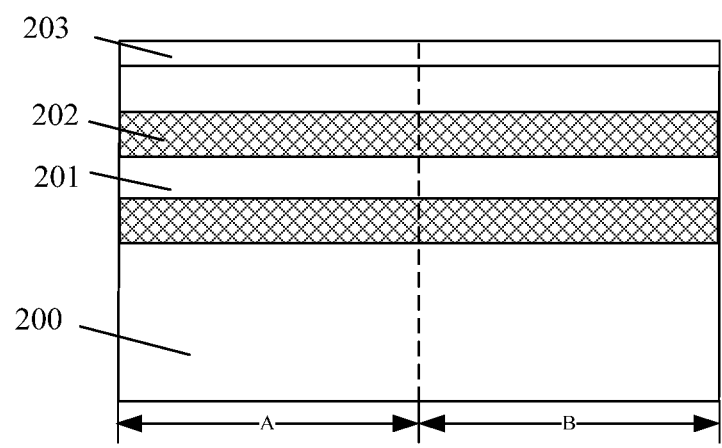
FIGS. 2-10 illustrate structures corresponding to certain stages during an exemplary fabrication process of a semiconductor device consistent with various disclosed embodiments.

As shown in FIG. 11, at the beginning of the fabrication process, a semiconductor substrate with certain structures is provided (S101). FIG. 2 illustrates a corresponding structure.

As shown in FIG. 2, a semiconductor substrate 200 is provided. The semiconductor substrate 200 may include a logic region A and a peripheral region B.

Further, a fin material film may be formed on the semiconductor substrate 200. The fin material film may include a plurality of layers of first fin films 201 stacked along a normal direction of a surface of the semiconductor substrate 200; and a second fin film 202 between two adjacent first fin films 201. Further, a fin protective film 203 may be formed on the surface of the fin material film.

The fin material film may provide a material layer for subsequently forming initial fins. The fin protective film 203 may protect the top surfaces of the fins when the fins are subsequently formed.

The semiconductor substrate 200 may be made of single crystal silicon, polycrystalline silicon, or amorphous silicon. The semiconductor substrate 200 may also be made of other appropriate semiconductor material such as germanium, silicon germanium, or gallium arsenide, etc. In one embodiment, the semiconductor substrate 200 is made of single crystal silicon.

The material of the first fin films 201 and the material of the second fin films 202 may be different. The material of the first fin films 201 may be single crystal silicon, or single crystal germanium silicon, etc. The material of the second fin films 202 may be single crystal silicon, or single crystal germanium silicon, etc.

When the material of the first fin films 201 is single crystal silicon, the material of the second fin film 202 may be single crystal silicon germanium, etc. When the material of the first fin films 201 is single crystal silicon germanium, the material of the second fin film 202 may be single crystal silicon, etc.

In one embodiment, the material of the first fin films 201 is single crystal silicon; and the material of the second fin films 202 is single crystal silicon germanium. In another embodiment, the material of the first fin films 201 is single crystal silicon germanium, and the material of the second fin film 202 is single crystal silicon.

Figure 3:
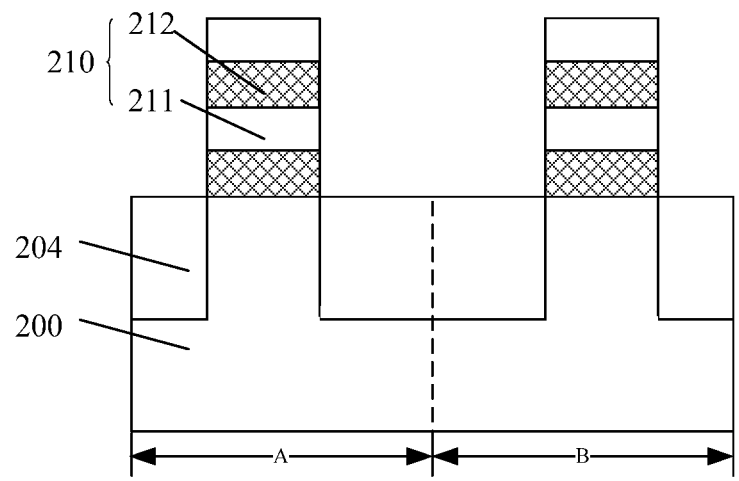

Returning to FIG. 11, after forming the fin material film, initial fins may be formed (S102). FIG. 3 illustrates a corresponding semiconductor structure.

As shown in FIG. 3, the fin material film may etched to form an initial fin 210 on the logic region A of the semiconductor substrate 200 and an initial fin 210 on the peripheral region B of the semiconductor substrate 200. The initial fin 210 may include a plurality of first fin layers 211 stacked along the normal direction of the surface of the semiconductor substrate 200 and a second fin layer 212 between two adjacent first fin layers 211.

The method for forming the initial fins 210 may include forming a patterned layer (not shown) on the fin material film to cover portions of the fin material film; and etching the fin material film using the patterned layer as an etching mask to form the initial fins 210, and to form the first fin films 201 into the first fin layers 211 and form the second fin films 202 into the second fin layers 212.

In one embodiment, the material of the first fin layers 211 is single crystal silicon; and the material of the second fin layers 212 is single crystal silicon germanium.

The initial fins of the alternatively stacked structure may provide an initial structure for subsequently forming of a gate-all-around structure.

Further, as shown in FIG. 3, an isolation structure 201 may be formed over the semiconductor substrate 200. The isolation structure 201 may cover the bottom portions of the sidewall surfaces of the initial fins 210.

The top surface of the isolation structure 201 may be lower than the bottom surface of the second fin layer 212 at the bottom of the initial fins 210, or may level with the bottom surface of the second fin layer 212 at the bottom of the initial fins 210. The distance between the top surface of the isolation structure 201 and the bottom surface of the second fin layer 212 at the bottom of the initial fins 210 may be in a range of approximately 0-200 angstroms. In one embodiment, the top surface of the isolation structure 201 levels with the bottom surface of the second fin layer 212 at the bottom of the initial fins 210.

The isolation structure 201 may be made of any appropriate material. In one embodiment, the isolation structure 201 is made of silicon oxide.

The method for forming the isolation structure 201 may include forming an isolation structure film covering the initial fins 210 on the semiconductor substrate 200; planarizing the isolation structure film until the top surface of the initial fin 210 is exposed. Then, the isolation structure film may be etched back to form the isolation structure 201.

The process for forming the isolation structure film may be a deposition process, such as a flowable chemical vapor deposition (FCVD) process, etc. In one embodiment, the isolation structure film is formed by an FCVD process such that the filling performance of the isolation structure film may be as desired.

The step for forming the isolation structure film using the FCVD process may include forming an isolation fluid layer on the semiconductor substrate 200; and performing a water vapor annealing to the isolation fluid layer to form the isolation structure film.

The parameters of the water vapor annealing process may include followings. The gases used in the water vapor annealing process may include oxygen, ozone and gaseous water, etc.; and the annealing temperature may be in a range of approximately 350° C.-750° C.

Figure 4:
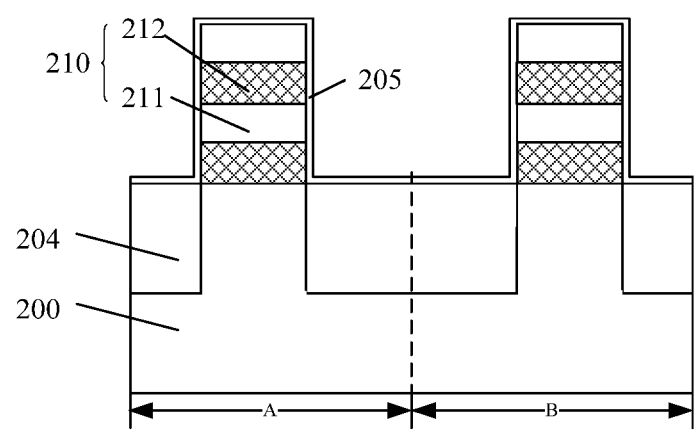

Returning to FIG. 11, after forming the insolation structure, a first dummy gate dielectric layer may be formed (S103). FIG. 4 illustrates a corresponding semiconductor structure.

As shown in FIG. 4, a first dummy gate dielectric layer 205 is formed on the top and sidewall surfaces of the initial fins 210. The first dummy gate dielectric layer 205 may provide a material layer for subsequently forming a first dummy gate structure, and protect the initial fin 210 in the logic region A when the protective layer 203 is subsequently removed.

In some embodiments, after the protective layer in the logic region is removed, a first dummy gate dielectric layer may be formed on the top and sidewall surfaces of the initial fin in the logic region. In other embodiments, when a second interfacial layer is formed, the first dummy gate dielectric layer may be formed on the top and sidewall surfaces of the initial fin in the logic region.

In one embodiment, the first dummy gate dielectric layer 205 is formed on the sidewall and top surfaces of the initial fin 210 in the logic region A and on the sidewall and top surfaces of the initial fin 210 in the peripheral region B. In another embodiment, the first dummy gate dielectric layer 205 may not be formed on the sidewall and top surfaces of the initial fin 210 in the peripheral region B.

The first dummy gate dielectric layer 205 may be made of any appropriate material, such as silicon oxide, silicon nitride, silicon oxynitride, silicon oxycarbide, silicon carbonitride, or silicon oxycarbonitride, etc. In one embodiment, the first dummy gate dielectric layer 205 is made silicon oxide. The thickness of the first dummy gate dielectric layer 205 may be in a range of approximately 20 angstroms-50 angstroms.

The process for the first dummy gate dielectric layer 205 may include a chemical vapor deposition (CVD) process, a physical vapor deposition (PVD) process, or an atomic layer deposition (ALD) process, etc. In one embodiment, the first dummy gate dielectric layer 205 is formed by an ALD process.

Figure 5:
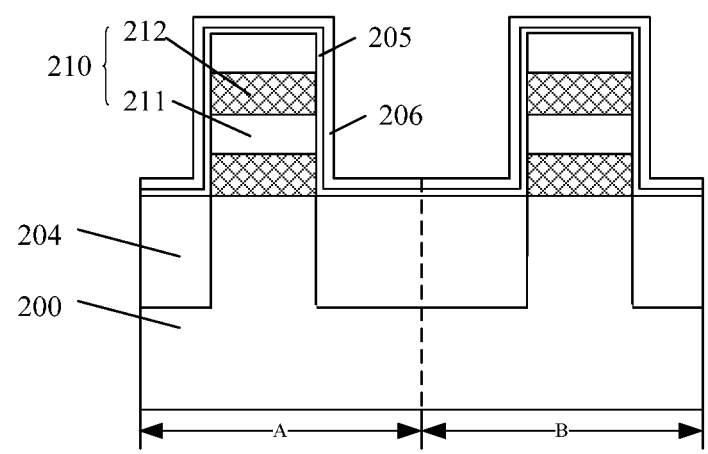

Returning to FIG. 11, after forming the first dummy gate dielectric layer, an initial protective layer may be formed (S104). FIG. 5 illustrates a corresponding semiconductor structure.

As shown in FIG. 5, an initial protective layer 206 is formed on the surface of the first dummy gate dielectric layer 205. The initial protective layer 206 may be provide a layer of material for subsequently forming a protective layer.

The initial protective layer 206 may be formed on the surface of the first dummy gate dielectric layer 205; and may covers the sidewall and top surfaces of the initial fin 210 in the logic region A. The initial protective layer 206 may also cover the sidewall and top surfaces of the initial fin 210 in the peripheral region B.

The initial protective layer 206 may be made of any appropriate material, such as silicon oxide, silicon nitride, silicon oxynitride, silicon oxycarbide, silicon carbonitride or silicon oxycarbonitride, etc. The thickness of the initial protective layer 206 may be in a range of approximately 10 angstroms-35 angstroms.

Various processes may be used to form the initial protective layer 206, such as a CVD process, a PVD process, or an ALD process, etc. In one embodiment, the initial protective layer 206 is formed by a CVD process.

Figure 6:
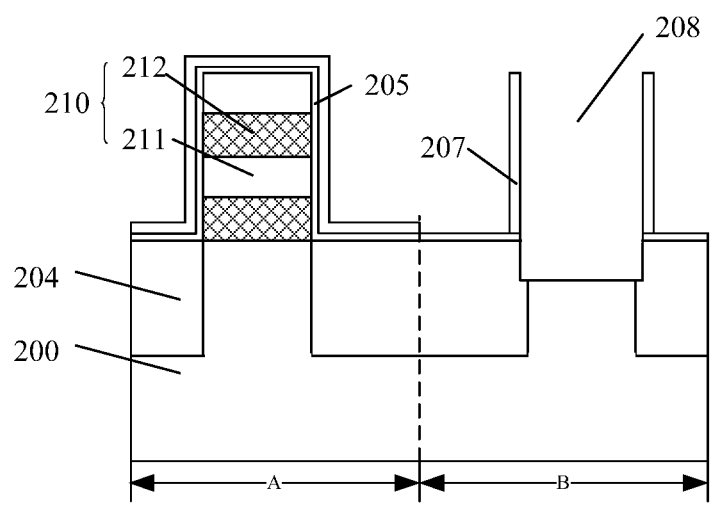

Returning to FIG. 11, after forming the initial protective layer, a protective layer may be formed (S105). FIG. 6 illustrates a corresponding semiconductor structure.

As shown in FIG. 6, a protective layer 207 may be formed on the sidewall surfaces of the initial fin 210 in the peripheral region B by etching back the initial protective layer 206 in the peripheral region B. The protective layer 207 may expose the top surface of the initial fin 210 in the peripheral region B.

A portion of the protective layer 207 may also cover the top and sidewall surfaces of the initial fin 210 in the logic region A.

The protective layer 207 may provide a barrier structure for subsequently forming a regular shaped modified fin by limiting the growth direction when the modified fin is formed.

The method for forming the protective layer 207 may include forming a mask layer (not shown) on the surface of the initial protective layer 206 to cover the top and sidewall surfaces of the initial fin 210 in the logic region A; and etching back the initial protective layer 206 using the mask layer as an etching mask until the top surface of the initial fin 210 in the peripheral region B is exposed to form the protective layer 207.

In one embodiment, after the initial protection layer 206 is etched back, the first dummy gate dielectric layer 205 on the top surface of the initial fin 210 in the peripheral region B may be removed to expose the top surface of the initial fin 210 in the peripheral region B to form the protective layer 207.

The mask layer may be made of any appropriate material. In one embodiment, the material of the mask layer is photoresist.

After forming the protective layer 207, the mask layer may be removed. Various processes may be used to remove the mask layer. In one embodiment, the mask layer is removed by an ashing process.

The protective layer 207 may be made of any appropriate material. In one embodiment, the protective layer 207 is made of silicon nitride. In another embodiment, the protective layer 207 is made of silicon oxynitride.

Further, as shown in FIG. 6, after forming the protective layer 207, the initial fin 210 in the peripheral region B may be removed; and a trench 208 may be formed between two portions of the protective layer 207 in the peripheral region B. The trench 208 may provide a space for subsequently forming a modified fin. The bottom surface of the trench 208 may be lower than the bottom surface of the second fin layer 212 at the bottom of the initial fin 210 in the logic region A.

In one embodiment, a portion of the first dummy gate dielectric layer 205 on the sidewall surfaces of the initial fin 210 in the peripheral region B may also be removed. In another embodiment, the portions of the first dummy gate dielectric layer 205 on the sidewall surfaces of the initial fin 210 in the peripheral region B may be retained; and may be subsequently removed together with the protective layer 207.

Various processes may be used to remove the initial fin 210 in the peripheral region B. In one embodiment, the process for removing the initial fin 210 in the peripheral region B may include a dry etching process.

In one embodiment, the process for removing the initial fin 210 in the peripheral region B includes a dry etching process, and the parameters of the dry etching process may include a following combination. In a first stage of the dry etching process, the etching gases may include $CF_4$ and $H_2$; the flow rate of $CF_4$ may be in range of approximately 5 sccm-300 sccm; the flow rate of $H_2$ may be in a range of approximately 20 sccm-500 sccm; the etching time may be in a range of approximately 5 s-50 s; and the etching temperature may be approximately 70° C. In a second stage of the dry etching process. The etching gas may be a mixture of $CH_3F$, $O_2$ and He; the flow rate of $CH_3F$ may be in a range of approximately 60 sccm-800 sccm; the flow rate $O_2$ may be in range of approximately 5 sccm-200 sccm; the flow rate of He may be in range of approximately 60 sccm-200 sccm; the etching time may be in a range of approximately 5 s-100 s; and the etching temperature may be in a range of approximately 35° C.-85° C.

Figure 7:
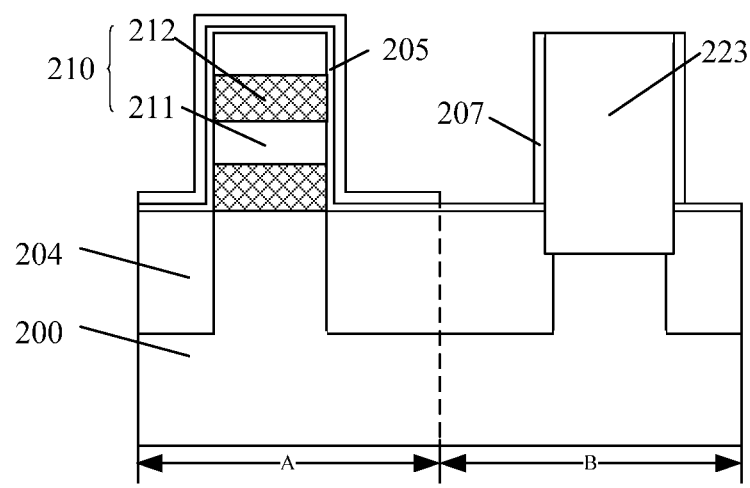

Returning to FIG. 11, after forming the trench, a modified fin may be formed (S106). FIG. 7 illustrates a corresponding semiconductor structure.

As shown in FIG. 7, a modified fin 223 may be formed in the trench 208. The modified fin 223 may be made of a single material. The modified fin 223 may be a fin in the peripheral region B; and other structures of the semiconductor device may be subsequently formed on the modified fin 223.

The material of the modified fin 223 is a single material, and a second gate structure of a gate-all-around structure may not be formed subsequently. When a second gate structure is formed on the surface of the modified fin 223 with the single material, a substantially thick second gate dielectric layer of the second gate structure may not affect the deposition of a second gate electrode layer of the second gate structure. Thus, the quality of the formed second gate layer may be as desired; and the performance of the peripheral device may be improved. Accordingly, the performance of the semiconductor device may be enhanced.

The modified fin 210 may be made of any appropriate material, such as single crystal silicon, single crystal germanium, or silicon germanium, etc. In one embodiment, the material of the modified fin portion 223 is single crystal silicon.

In another embodiment, the material of the modified fin portion 223 is a single crystal silicon germanium. When the single crystal silicon germanium is used as the fin material, the carrier mobility of the channel region may be increased. Thus, the performance of the formed semiconductor device may be enhanced.

Various processes may be used to form the modified fin 223 in the trench 208. In one embodiment, an epitaxial growth process is used to form the modified fin 223.

In one embodiment, the parameters of the epitaxial growth process may include a following combination. The gases of the epitaxial growth process may include hydrogen, HCl gas, and $SiH_2Cl_2$. The flow rate of hydrogen may be in a range of approximately 2000 sccm-20000 sccm; the flow rate of HCl may be in a range of approximately 30 sccm-150 sccm; and the flow rate of $SiH_2Cl_2$ may be in a range of approximately 50 sccm-1000 sccm. The chamber pressure may be in a range of approximately 10 Torr-600 Torr; and the temperature may be in a range of approximately 650° C.-850° C.

Figure 8:
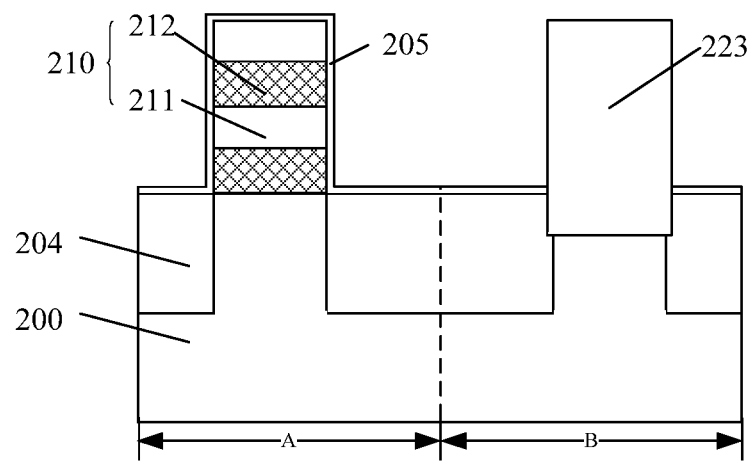

Returning to FIG. 13, after forming the modified fin, the protective layer may be removed (S107). FIG. 8 illustrates a corresponding semiconductor structure.

As shown in FIG. 8, the protective layer 207 on the sidewall surfaces of the modified fin 223 may be removed to expose the top and sidewall surfaces of the modified fin 223. By removing the protective layer 207 on the sidewall surfaces of the modified fin 223, a second interfacial layer may be subsequently formed on the exposed surfaces of the modified fin 223.

In one embodiment, the portion of the protective layer 207 on the initial fin 210 in the logic region A may also be removed to expose the first dummy gate dielectric layer 205 covering the top and sidewall surfaces of the initial fin 210 in the logic region A.

In one embodiment, the first dummy gate dielectric layer 205 on the sidewall surfaces of the initial fin 210 in the peripheral region B may also be removed.

The process for removing the protective layer 207 on the sidewall surfaces of the modified fin 223 and on the initial fin 210 in the logic region A may include a dry etching process, or a wet etching process, etc.

In one embodiment, the protective layer 207 on the sidewall surfaces of the modified fin 223 is removed by a dry etching process. The parameters of the dry etching process may include a following combination. The etching gases may include $H_2$, $CH_3F$, $N_2$, and $O_2$. The flow rate of the $CH_3F$ gas may be in a range of approximately 8 sccm-50 sccm. The flow rate of $N_2$ may be approximately 200 sccm. The flow rate of $O_2$ may be in a range of approximately 5 sccm-60 sccm. The power of the RF source may be in a range of approximately 80 W-300 W. The bias voltage may be in a range of approximately 30 V-100 V. The chamber pressure may be in a range of approximately 10 mTorr-200 mTorr. The etching time may be in range of approximately 4 s-50 s.

After removing the protective layer, a first gate structure may be formed across the initial fin in the logic region. The first gate structure may include a first gate dielectric layer. The first gate structure may surround the first fin layers in the logic region. Further, a second gate structure may be formed across the modified fin. The second gate structure may include a second gate dielectric layer. The thickness of the second gate dielectric layer may be greater than a thickness of the first gate dielectric layer.

In one embodiment, the first gate structure and the second gate structure may be formed by a gate-last process.

Before forming the first gate structure and the second gate structure, a dielectric layer may be formed on the semiconductor substrate. The dielectric layer may have a first gate opening and a second gate opening. The first gate structure may be formed in the first gate opening; and the second gate structure may be formed in the second gate opening.

Before forming the dielectric layer, a first dummy gate structure may be formed across the initial fin in the logic region. The first dummy gate structure may cover the sidewall and top surfaces of the initial fin in the logic region. The dielectric layer may cover the sidewall surfaces of the first dummy gate structure.

The method for forming the first gate opening may include removing the first dummy gate structure to form an initial first gate opening in the dielectric layer. The initial first gate opening may be disposed in the logic region. Then, the second fin layers exposed by the initial first gate opening may be removed such that the initial first gate opening may form the first gate opening and the first gate opening may be formed in dielectric layer in the logic region.

Before forming the dielectric layer, a second dummy gate structure may be formed across the modified fin. The second dummy gate structure may cover the sidewall and top surfaces of the modified fin. The dielectric layer may cover the sidewall surfaces of the second dummy gate structure. Then, the second dummy gate structure may be removed to form the second gate opening in the dielectric layer in the peripheral region; and the second gate structure may be formed in the second gate opening.

In particular, the method forming the first gate structure includes forming a first dummy gate structure across the initial fin in the logic region. The first dummy gate structure may cover the top and sidewall surfaces of the initial fin in the logic region. Then, the first dummy gate structure and the second fin layers in the logic region and covered by the first dummy gate structure may be removed to form the first gate opening in the dielectric layer in the logic region. Then, the first gate structure may be formed in the first gate opening. The first gate structure may surround the first fin layers in the logic region.

In particular, the method for forming the second gate structure may include forming a second dummy gate structure across the modified fin; removing the second dummy gate structure to form the second gate opening in the dielectric layer in the peripheral region; and forming the second gate structure in the second gate opening.

The first dummy gate structure may include a first dummy gate dielectric layer and a first dummy gate electrode layer. The second dummy gate structure may include a second dummy gate dielectric layer and a second dummy gate electrode layer.

The first gate structure may include a first gate dielectric layer and a first gate electrode layer. The second gate structure may include a second gate dielectric layer and a second gate electrode layer.

In one embodiment, the first gate dielectric layer may include a first interface layer and a first gate dielectric body layer. The first interface layer may be formed on the bottom of the first gate opening; and the first gate dielectric body layer may be formed on the bottom and sidewall surfaces of the first gate opening and cover the surface of the first interface layer.

In one embodiment, the second gate dielectric layer may include a second interface layer and a second gate dielectric body layer. The second interface layer may be formed on the bottom of the second gate opening; and the second gate dielectric body layer may be formed on the bottom and sidewall surfaces of the second gate opening and cover the surface of the second interface layer.

To meet the requirements of the peripheral semiconductor device, the thickness of the second interface layer of the second gate structure may be substantially thick; and the quality requirements of the second interface layer may not be very high. Thus, the second dummy gate dielectric layer may be used as the second interface layer. In particular, when the second dummy gate structure is removed, the second dummy gate electrode layer may be removed, and the second dummy gate dielectric layer may be retained as the second interface layer or the second dummy gate dielectric layer of the subsequently formed second gate structure.

In one embodiment, the second dummy gate dielectric layer is used as the second interface layer of the subsequently formed second gate structure.

In one embodiment, before forming the dielectric layer, the second interface layer may be formed on the surface of the modified fin; and the second gate opening may expose the second interface layer. In another embodiment, after forming the second gate opening, a second interfacial layer may be formed on the bottom of the second gate opening.

In particular, returning to FIG. 11, after removing the protective layer, a second interface layer may be formed (S108). FIG. 9 illustrates a corresponding semiconductor structure.

As shown in FIG. 9, a second interface layer 241 is formed on the surface of the modified fin 223 in the peripheral region B. The second interface layer 241 may improve the surface state between the subsequently formed second gate dielectric layer and the modified fin 223, and may serve as an isolation layer between the second gate layer of the second gate structure and the modified fin 223.

The first gate dielectric layer may include the first interface layer and a first gate dielectric body layer; and the second gate dielectric layer may include the second interface layer and a second gate dielectric body layer. The second interface layer may have a thickness greater than the thickness of the first interface layer; and the second gate dielectric layer may have a thickness greater than the thickness of the first gate dielectric layer. The logic region may be used to form a logic device; and the peripheral region may be used to form a peripheral device. The material of the modified fin in the peripheral region may be a single material. The thickness of the second gate dielectric layer covering the modified fin may be substantially thick to meet the performance requirements of the peripheral device under a high voltage. At the same time, the first gate structure in the logic region may surround the first fin layers in the logic region. Thus, the control capability of the first gate structure to the channel region may be increased; and the performance of the semiconductor device formed by the logic region may be enhanced. Accordingly, the integration of the semiconductor device in the logic region and the semiconductor device in the peripheral region may be implemented; and the performance of the semiconductor device may be improved.

The thickness of the second interface layer 241 may be in a range of 25 angstroms-45 angstroms.

The process for forming the second interface layer 241 may include a CVD process, a PVD process, or an ALD process, etc. In one embodiment, the second interface layer 241 is formed by an ALD process. An organic precursor gas containing Si and O may be used as the source gas of the ALD process. The temperature of the ALD process may be in a range of 80° C.-300° C. The pressure of the ALD process may be in a range of approximately 5 mTorr-20 Torr; and the cycle of processes may be in a range of approximately 5-100 times.

Returning to FIG. 11, after forming the second interface layer, a first gate structure and a second gate structure may be formed (S109). FIG. 10 illustrates a corresponding semiconductor structure.

As shown in FIG. 10, a first gate structure is formed across the initial fin 210 in the logic region A. The first gate structure may surround the first fin layers 211 in the logic region A. Further, a second gate structure may be formed across the modified fin portion 233.

The method for forming the first gate structure and the second gate structure may include forming a first dummy gate layer (not shown) across the initial fin portion 210 in the logic region A and on a surface of the first gate dielectric layer 205 in the logic region A; forming a dielectric layer (not shown) over the semiconductor substrate 200 by covering the sidewall surfaces of the first dummy gate layer and the second dummy gate layer and exposing the top surfaces of the first dummy gate layer and the second dummy gate layer; removing the the first dummy gate dielectric layer 205 in the logic region A, and the second fin layers 212 in the logic region A and covered by the first dummy gate layer to form a first gate opening in the dielectric layer in the logic region A; and forming a first gate dielectric body layer 232 and a first gate electrode layer 234 in the first gate opening. The first gate dielectric body layer 232 may be formed on the sidewall surfaces and the bottom of the first gate opening; and may cover the surface of the first interface layer 231. The first gate electrode layer 234 may be formed on the surface of the first gate dielectric body layer 232. The top surface of the first gate electrode layer 234 may level with the surface of the dielectric layer.

The method for forming the second gate structure may include forming a second dummy gate layer (not shown) across the modified fin 223 in the peripheral region B. The second dummy gate layer may be formed on the surface of the second interface layer 241 and may cover a portion of the top surface of the isolation structure 204 in the peripheral portion B. After forming the second dummy gate layer, the second dummy gate layer may be removed to form a second gate opening in the dielectric layer in the peripheral region B; and the second gate dielectric body layer 232 and the second gate electrode layer 244 may be formed in the second gate opening. The second gate dielectric body layer 232 may be formed on the bottom and sidewall surfaces of the second gate opening and cover the surface of the second interface layer 241. The second gate electrode layer 244 may be formed on the surface of the second gate dielectric body layer 232; and the top surface of the second gate electrode layer 244 may level with the surface of the dielectric layer.

In one embodiment, the first dummy gate layer and the second dummy gate layer are formed simultaneously. In another embodiment, the first dummy gate layer and the second dummy gate layer may be formed separately.

In some embodiments, the first gate dielectric body layer 232 and the second gate dielectric body layer 232 are formed simultaneously. In other embodiments, the first gate dielectric body layer 232 and the second gate dielectric body layer 232 may be formed separately.

In one embodiment, the first gate electrode layer 234 and the second gate electrode layer 244 are formed simultaneously. In another embodiment, the first gate electrode layer 234 and the second gate electrode layer 244 may be formed separately.

The first gate structure may further include a first work function layer 233 between the first gate dielectric body layer 232 and the first gate electrode layer 234. The second gate structure may further include a second work function layer 243 between the second gate dielectric body layer 232 and the second gate electrode layer 244.

The first work function layer 233 and/or the second work function layer 243 may be used to adjust the threshold voltage of the formed semiconductor device.

When the first gate structure or the second gate structure is used to form a P-type device, the material of the first work function layer 233 or the second work function layer 243 may be titanium oxide, or titanium nitride etc. When the first gate structure or a second gate structure is used to form an N-type device, the material of the first work function layer 233 or the second work function layer 243 may be titanium, or tantalum, etc.

The first interface layer and the second interface layer may be made of any appropriate material, such as silicon oxide, etc.

The material of the first gate dielectric layer and/or the second gate dielectric layer may be a high-K dielectric material (a dielectric coefficient greater than 3.9). The high-K dielectric material may include yttrium oxide, zirconium oxide, hafnium silicon oxide, hafnium oxide, zirconium oxide Silicon, titanium oxide, cerium oxide, titanium cerium oxide, titanium cerium oxide, titanium cerium oxide, or aluminum oxide, etc.

The material of the first gate layer and/or the second gate layer may be a metal material. The metal material may include one or more of copper, tungsten, nickel, chromium, titanium, tantalum, and aluminum, etc.

The logic region may be used to form a logic device; and the peripheral region may be used to form a peripheral device. The modified fin in the peripheral region may be made of a single material. The second gate dielectric layer covering the modified fin may consist of the second interface layer and the second gate dielectric body layer. The second interface layer may be substantially thick; and the second gate dielectric layer may meet the performance requirements of the peripheral device under a substantially high voltage. Further, the first gate structure in the logic region may surround the first fin layers in the logic region; and the first gate structure may have an enhanced control capability to the channel region of the semiconductor device. Thus, the performance of the semiconductor device formed by the logic region may be improved. Accordingly, the integration of the semiconductor device in the logic region and the semiconductor device in the peripheral region may be realized; and the performance of the semiconductor device may be enhanced.

The present disclosure also provides a semiconductor device. FIG. 10 illustrates a corresponding semiconductor device.

As shown in FIG. 10, the semiconductor device may include a semiconductor substrate 200 having a logic region A and a peripheral region B; and an initial fin formed on a logic region A of the semiconductor substrate 200. The initial fin may include a plurality of first fin layers 211 stacked along the normal direction of the surface of the semiconductor substrate 200. The semiconductor device may also include a modified fin 223 formed on the surface of the peripheral region B of the semiconductor substrate 200. The material of the modified fin 223 may be a single material. Further, the semiconductor device may include the first gate structure formed across the initial fin. The first gate structure may include a first gate dielectric layer; and surround the fin layers of the initial fin. Further, the semiconductor device may include a second gate structure formed across the modified fin 223. The second gate structure may include a second gate dielectric layer; and the second gate dielectric layer may have a thickness greater than a thickness of the first gate dielectric layer. The detailed structures and intermediate structures are described above with respect to the fabrication processes.

The modified fin 223 may be made of any appropriate material, such as single crystal silicon, single crystal germanium, or silicon germanium, etc. The details of the semiconductor substrate 200 may be referred to the previous description.

In the disclosed method for forming a semiconductor device, a logic region may be used to form a logic device; and a peripheral region may be used to form a peripheral device. a modified fin in the peripheral region may be made of a single material. The second gate dielectric layer covering the modified fin may be substantially thick; and the performance requirements of the peripheral device at a high voltage may be met. At the same time, the first gate structure in the logic region may surround the first fin layers in the logic region. Thus, the control capability of the first gate structure to the channel of the semiconductor device may be enhanced, and the performance of the semiconductor device formed by the logic region may be improved. Accordingly, the process integration of the semiconductor device in the logic region and the semiconductor device in the peripheral region may be implemented; and the performance of the semiconductor device may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor device, comprising:
   providing a semiconductor substrate having a logic region and a peripheral region;
   forming initial fins and an isolation structure on the logic region and the peripheral region of the semiconductor substrate, wherein the initial fin consists of a plurality of first fin layers and second fin layers stacked along a normal of a surface of the semiconductor substrate, a second fin layer is formed between two adjacent first fin layers, and the isolation structure covers portions of sidewall surfaces of the initial fins;
   forming a first gate dielectric layer on the initial fins;
   forming a protective layer covering the first gate dielectric layer on the sidewall surfaces of the initial fin in the peripheral region and exposing a top surface of the initial fin in the peripheral region;
   removing the first gate dielectric layer on the sidewall surfaces of the initial fin in the peripheral region and the initial fin in the peripheral region to form a trench with a bottom surface lower than a top surface of the isolation structure in the protective layer in the peripheral region;
   forming a modified fin made of a single material in the trench;
   removing the protective layer to expose top and sidewall surfaces of the modified fin;
   forming a first gate structure having the first gate dielectric layer and surrounding the first fin layers in the logic region across the initial fin in the logic region; and
   forming a second gate structure having a second gate dielectric layer with a thickness greater than a thickness of the first gate dielectric layer across the modified fins.

2. The method according to claim 1, wherein:
   the modified fin is formed in the trench by an epitaxial growth process.

3. The method according to claim 1, wherein:
   the protective layer also covers top and sidewall surfaces of the initial fin in the logic region.

4. The method according to claim 1, wherein:
   the protective layer is made of one of silicon oxide, silicon nitride, silicon oxynitride, silicon oxycarbide, silicon carbonitride and silicon oxynitride.

5. The method according to claim 1, wherein forming the initial fins comprises:
   forming a fin material film having a plurality of first fin films stacked along the normal of the surface of the semiconductor substrate and a second fin film between two adjacent first fin films on the semiconductor substrate;
   forming a patterned layer on the fin material film; and
   etching the fin material film using the patterned layer as an etching mask to form the initial fins, wherein the first fin films are formed into first fin layers and the second fin films are formed into second fin layers.

6. The method according to claim 5, wherein:
   the first fin layers and the second fin layers are made of different materials;
   the first fin layers are made of single crystal silicon or single crystal silicon germanium; and
   the second fin layers are made of single crystal silicon or single crystal silicon germanium.

7. A method for fabricating a semiconductor device, comprising:
   providing a semiconductor substrate having a logic region and a peripheral region;
   forming initial fins and an isolation structure on the logic region and the peripheral region of the semiconductor substrate, wherein the initial fin consists of a plurality of first fin layers and second fin layers stacked along a normal of a surface of the semiconductor substrate, a second fin layer is formed between two adjacent first fin layers, and the isolation structure covers portions of sidewall surfaces of the initial fins;
   forming a protective layer on the sidewall surfaces of the initial fin in the peripheral region and exposing a top surface of the initial fin in the peripheral region;
   removing the initial fin in the peripheral region to form a trench with a bottom surface lower than a top surface of the isolation structure in the protective layer in the peripheral region;
   forming a modified fin made of a single material in the trench;
   removing the protective layer to expose top and sidewall surfaces of the modified fin;
   forming a first gate structure having a first gate dielectric layer and surrounding the first fin layers in the logic region across the initial fin in the logic region; and
   forming a second gate structure having a second gate dielectric layer with a thickness greater than a thickness of the first gate dielectric layer across the modified fins, wherein the protective layer also covers top and sidewall surfaces of the initial fin in the logic region and forming the protective layer comprises:
   forming an initial protective layer on the semiconductor substrate to cover portions of the top and sidewall surfaces of the initial fins;
   forming a mask layer on the initial protective layer in the logic region; and
   etching-back the initial protective layer using the mask layer as an etching mask until the top surface of the initial fin in the peripheral region is exposed.

8. The method according to claim 7, wherein:
   the modified fin is formed in the trench by an epitaxial growth process.

9. The method according to claim 7, wherein:
the protective layer is made of one of silicon oxide, silicon nitride, silicon oxynitride, silicon oxycarbide, silicon carbonitride and silicon oxynitride.

10. A method for fabricating a semiconductor device, comprising:
providing a semiconductor substrate having a logic region and a peripheral region;
forming initial fins and an isolation structure on the logic region and the peripheral region of the semiconductor substrate, wherein the initial fin consists of a plurality of first fin layers and second fin layers stacked along a normal of a surface of the semiconductor substrate, a second fin layer is formed between two adjacent first fin layers, and the isolation structure covers portions of sidewall surfaces of the initial fins;
forming a protective layer on the sidewall surfaces of the initial fin in the peripheral region and exposing a top surface of the initial fin in the peripheral region;
removing the initial fin in the peripheral region to form a trench with a bottom surface lower than a top surface of the isolation structure in the protective layer in the peripheral region;
forming a modified fin made of a single material in the trench;
removing the protective layer to expose top and sidewall surfaces of the modified fin;
forming a first gate structure having a first gate dielectric layer and surrounding the first fin layers in the logic region across the initial fin in the logic region; and
forming a second gate structure having a second gate dielectric layer with a thickness greater than a thickness of the first gate dielectric layer across the modified fins;
before forming the first gate structure and the second gate structure, further comprising:
forming a dielectric layer having a first gate opening and a second gate opening on the semiconductor substrate; and
forming the first gate structure in the first gate opening and the second gate structure in the second gate opening.

11. The method according to claim 10, before forming the dielectric layer, further comprising:
forming a first dummy gate structure covering the top and sidewall surfaces of the initial fin in the logic region across the initial fin in the logic region, wherein the dielectric layer covers sidewall surfaces of the first dummy gate structure;
removing the first dummy gate structure to form an initial first gate opening in the dielectric layer in the logic region; and
removing the second fin layers exposed by the initial first gate opening to form the first gate opening in the dielectric layer.

12. The method according to claim 11, wherein:
the first gate dielectric layer consists of a first interface layer and a first gate dielectric body layer;
the first interface layer is formed on a bottom of the first gate opening; and
the first gate dielectric body layer is formed on the bottom and sidewall surfaces of the first gate opening and covers the first interface layer.

13. The method according to claim 12, wherein:
the second gate dielectric layer consists of a second interface layer and a second gate dielectric body layer;
the second interface layer is formed on a bottom of the second gate opening;
the second gate dielectric body layer is formed on the bottom and sidewall surfaces of the second gate opening and covers the second interface layer; and
a thickness of the second interface layer is greater than a thickness of the first interface layer.

14. The method according to claim 13, wherein:
the first gate dielectric body layer and the second gate dielectric body layer are formed simultaneously.

15. The method according to claim 13, wherein:
the second interface layer is formed on a surface of the modified fin before forming the dielectric layer; and
the second gate opening exposes the second interface layer.

16. The method according to claim 15, wherein the first dummy gate structure consists of a first dummy gate dielectric layer and a first dummy gate electrode layer, wherein forming the first gate opening comprises:
removing the first dummy gate electrode layer to expose the first dummy gate dielectric layer to form an initial first gate opening in the logic region;
removing the first dummy gate dielectric layer; and
removing the second fin layers exposed by the initial first gate opening in the logic region to form the first gate opening in the logic region.

17. The method according to claim 16, wherein:
the first dummy gate dielectric layer is formed on the top and sidewall surfaces of the initial fin in the logic region and the top and sidewall surfaces of the initial fin in the peripheral region before forming the protective layer; and
the protective layer exposes a top surface of the first dummy gate dielectric layer on the sidewall surfaces of the initial fin in the peripheral region and the top surfaces of the initial fin in the peripheral region.

18. The method according to claim 17, after forming the trench and before forming the modified fin, further comprising:
removing the first dummy gate dielectric layer on sidewall surfaces of the protective layer in the peripheral region.

19. The method according to claim 17, before forming one of the first gate structure and the second gate structure, further comprising
removing the first dummy gate dielectric layer on the sidewall surfaces of the protective layer in the peripheral region after removing the protective layer.

20. The method according to claim 10, before forming the dielectric layer, further comprising:
forming a second dummy gate structure covering portions of top and sidewall surfaces of the modified fin across the modified fin in the logic region, wherein the dielectric layer covers sidewall surfaces of the second dummy gate structure;
removing the second dummy gate structure to form the second gate opening in the dielectric layer in the peripheral region; and
forming the second gate structure in the second gate opening.

* * * * *